Sept. 25, 1956 J. F. CRAIB 2,764,678

PULSE STRETCHER

Filed June 7, 1951 2 Sheets-Sheet 1

INVENTOR
*JAMES F. CRAIB*
BY Leonard H. King
AGENT

PULSE STRETCHER

Filed June 7, 1951 2 Sheets-Sheet 2

INVENTOR
*JAMES F. CRAIB*
BY Leonard H. King
AGENT 2,764,678

PULSE STRETCHER

James F. Craib, Hicksville, N. Y., assignor to Airborne Instruments Laboratory, Incorporated, Mineola, N. Y.

Application June 7, 1951, Serial No. 230,408

18 Claims. (Cl. 250—27)

The present invention relates to an apparatus for increasing the duration of signal pulses.

In the design of circuits to handle pulses it frequently is desirable to increase the duration of each pulse of a series and yet preserve their relative amplitude. This operation has come to be known as pulse stretching. The product of the stretcher of this invention is an elongated pulse having an amplitude related to that of the input signal. This circuit is distinguished from the blocking oscillator and multivibrator types of circuit, which increase the duration of a pulse but lose information contained in the relative pulse amplitude, since a constant output signal is produced for all input signals large enough to trigger them. A desirable characteristic for a pulse stretcher would be one in which the amplitude of each pulse was maintained for a definite period after the input pulse has ended.

It is an object of this invention to provide a simple and efficient pulse stretcher.

It is another object of this invention to provide a compact pulse stretcher.

It is a principal object of this invention to provide a pulse stretcher yielding output pulses whose amplitude is proportional to its input pulse amplitude but whose duration may be many times that of the original pulse length.

It is still another object of this invention to provide a circuit which will produce an output pulse of constant length independent of the length of the input pulse.

Still a different object of this invention is to provide a circuit which will produce an elongated, shaped pulse.

Briefly stated, this invention discloses a circuit arrangement that permits the charging and discharging of a delay line in a novel fashion so as to obtain an electrical signal of desired waveshape.

The foregoing and other objects and features will become apparent in the course of the following description, taken in conjunction with the accompanying drawings in which.

Figure 1:
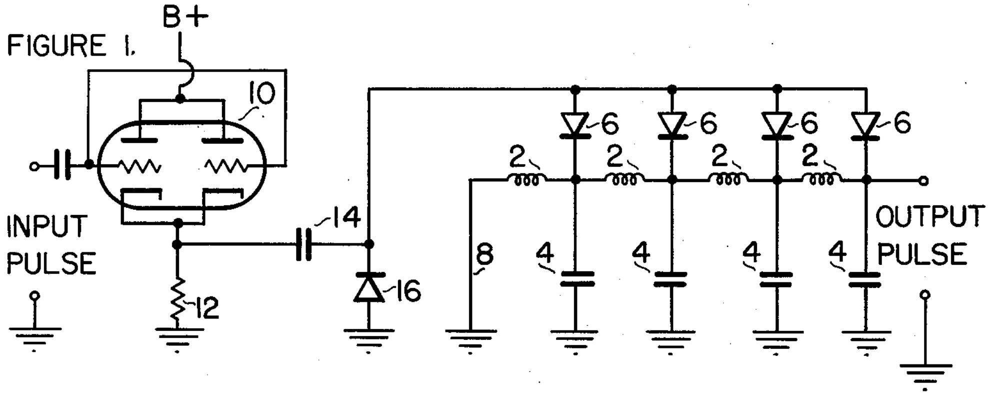
Figure 1 shows schematically the circuit of this invention.

In Figure 1 there is shown a multi-section repetitive delay network formed of series inductors 2 and shunt capacitors 4. The sections of this delay line are charged in parallel through a number of non-linear elements 6, which permit an incoming pulse to be applied simultaneously to all shunt capacitors 4. At the end of the pulse the non-linear elements present a high resistance in the back direction and the capacitors 4 are left charged to approximately the same voltage as that of the incoming pulse.

The line discharges through a low resistance short circuiting connection 8 at its end. This action will appear as a negative step of voltage (from line potential to zero) that progresses down the line discharging each capacitor in turn. When this discharging action reaches the open end of the line, the output pulse, which has been at maximum since the line was charged, is terminated. If a higher value of resistance is used in place of the short circuiting connection, secondary waves will be generated which will prevent the trailing edge of the pulse from smoothly dying out. It is to be noted that the inclusion of a capacitor in the end section is superfluous since it would be shorted out, however, the inductance serves as an added delay section.

Figure 2:
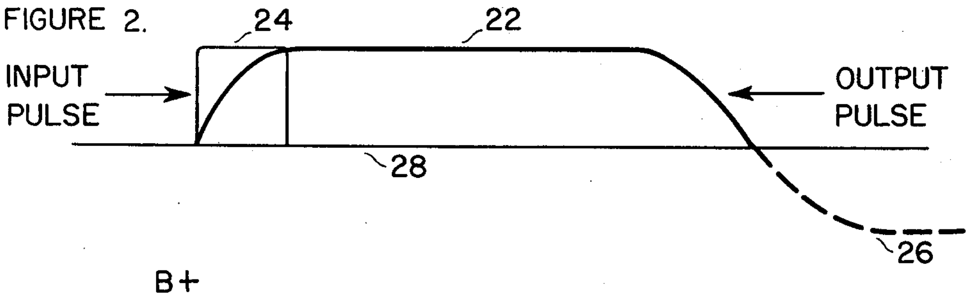
Figure 2 shows graphically the pulse shapes of typical input and output signals of the apparatus of this invention.

The output pulse 22 (Figure 2) rises as rapidly as the driving source 10 can charge the capacitors. This is nearly as fast as the input pulse 24 rise time. When the input pulse 24 ends, the output pulse 22 (appearing across the open end of the line) remains constant during the time that the discharge voltage wave requires to traverse the line. When the discharge wave reaches the open end of the line, it tends to appear at double amplitude (shown dotted in Figure 2). However, the non-linear elements 6 prevent a negative excursion 26 and the pulse ends at the base line 28.

It will be noticed that the trailing edge of the pulse is shown considerably more rounded than the leading edge. This is usually permissible and is due to the distortion of the discharge wave as it travels down the line. A line which gave less distortion of the trailing edge would have a wider passband and would, therefore, introduce less delay per section. To accomplish the same delay, more sections would be required including more non-linear elements 6. The trailing edge of the pulse is, therefore, permitted to be as round as possible to save size, weight, and cost of the components.

The flatness of the top of the pulse is affected by any leakage that can discharge the capacitors before the discharge wave reaches them. Back inductance of non-linear elements such as germanium diodes is such a source of leakage. Another source of leakage is the output circuit, which the line must feed. Usually, the stretcher is connected to a vacuum-tube grid. If possible, the connection should be made directly without a blocking capacitor. Where such a capacitor is used, the grid resistor must be made as large as possible. The use of a low line impedance will reduce the relative leakage through this resistor but will increase the current necessary to charge the line.

As shown in the preferred embodiment of Figure 1, the pulse stretcher is driven by a cathode follower 12 whose cathode impedance is in the range, 50 to 200 ohms. This impedance, which is in series with the forward resistance of the rectifiers, forms a time constant with the parallel combination of all the line capacitors which is short enough to charge within the duration of the incoming pulse. The driving tube 10 must be capable of delivering the peak current that will flow during the charging period. These considerations are not easily subject to analytic prediction because cathode impedance and non-linear forward resistance are not constant during the charging period, but change with the current. However, a safe design may be reached by first providing for the grid drive necessary at the instant when the pulse has been applied to the grid but the capacitors have not yet received any charge; then, the cathode impedance may be assumed to be some average value and the charging time constant calculated for this value.

When stretching pulses of the order of one microsecond to durations of the order of fifteen or twenty microseconds, it has been found practical to use a type 6J6 tube (both halves in parallel in a cathode follower circuit and a line impedance between 5,000 and 20,000 ohms. When germanium crystal diodes of the 1N34 type are used as the non-linear element, it is desirable to operate with pulse amplitudes of at least 2 volts. Values lower than this give stretched pulses whose tops are not flat due to discharge of the line by the diodes. Apparently lesser amplitudes fail to drive the diodes to a condition of sufficient back resistance to prevent discharge. Use of 625 $\mu\mu$f. capacitors in conjunction with 5.6 mh. inductances provided the desired stretching. Other suitable non-linear elements include diode vacuum tubes, silicon diodes, and selenium and copper oxide rectifiers.

Pulses of the order of 10 volts are about the maximum that can be handled by a type 6J6 tube cathode follower with the above circuit values. Higher amplitudes may have rise times so rapid that the cathode follower is driven into its grid-current region. This is permissible provided a low-impedance grid circuit or satisfactory D.-C. restoraton is provided.

Stretching may be increased by any practical amount by operating several stages in cascade, that is feeding the output pulse of one such unit to the input of a second unit. However, a cathode follower or other low impedance circuit, which may be a transformer, is needed between stages to provide proper impedance matching.

When a second pulse is applied to the stretcher before the first stretched pulse has completely left it, stretching of the second pulse proceeds without interrupting the stretching of the first pulse and without interaction between them. If the second pulse is equal in amplitude to the first, the output will continue uninterrupted to the end of the stretching interval of the second pulse. Should the second pulse be larger than the first, the output will remain at the amplitude of the first until the second one occurs and then increase to the amplitude of the second and remain there for the stretching interval. Should the second pulse be smaller than the first, the output will remain at the amplitude of the first pulse for the normal stretching interval of the first pulse and then drop to the amplitude of the second pulse.

This invention may also be used to produce elongated pulses having a desired complex waveshape by applying selected voltages to each non-linear element so as to cause the charging rate of each section of the line to differ.

Figure 4:
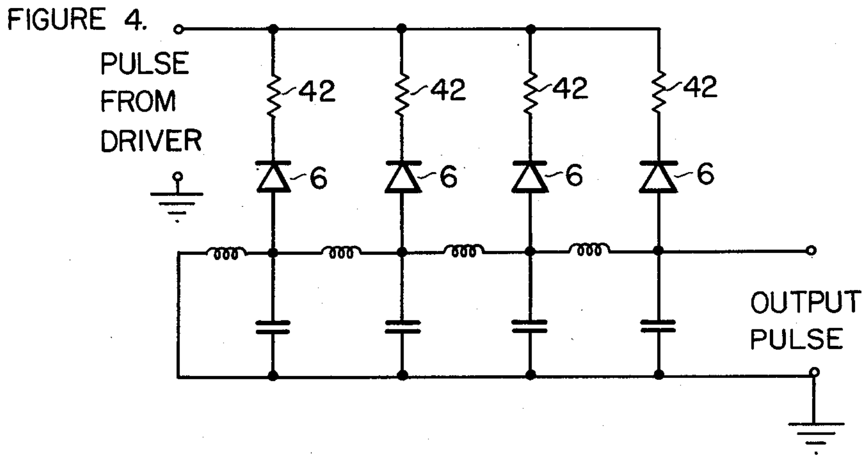
Figure 4 shows schematically an embodiment of this invention arranged to generate pulses having complex waveshapes.
Figure 5:
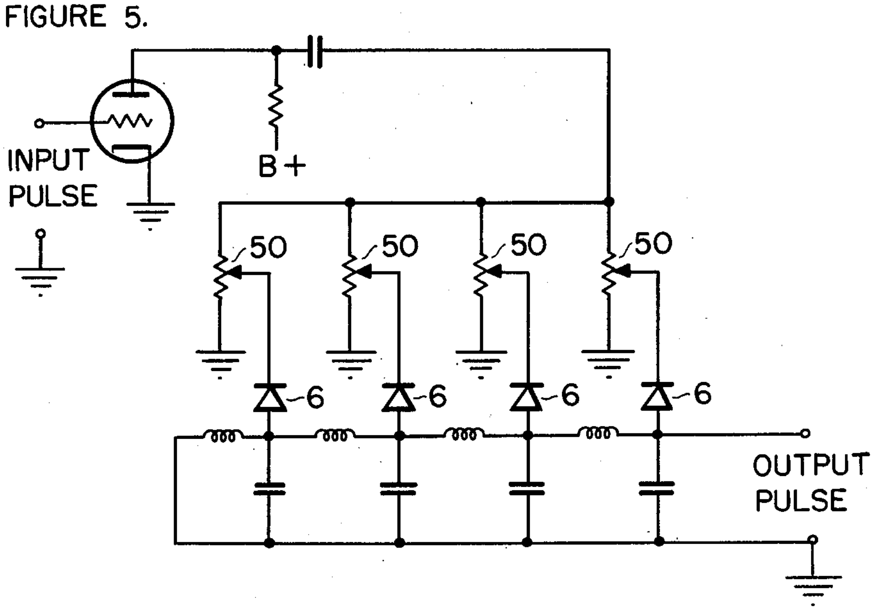
Figure 5 is a schematic presentation of an embodiment of this invention which permits varying of the output waveshape.

Various means may be used to supply such a voltage to each section such as incorporating a voltage dropping resistor 42 of suitable value in series with each non-linear element 6 as shown in Figure 4. Another method (Figure 5) is to feed the output of the driving stage into a number of voltage dividers in parallel, such as potentiometers 50, the variable arm of the potentiometer being connected to the non-linear element 6. Thus it is a simple matter to adjust the potentiometers to obtain the desired signal shape. The various sections of the line may also be fed by separate low impedance charging circuits each of which may then operate at an independent voltage level to produce the desired waveshape.

Figure 3:
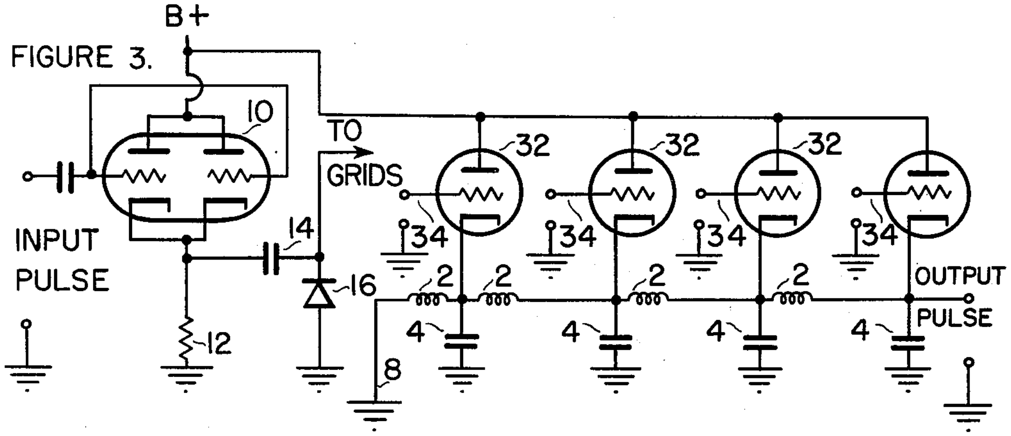
Figure 3 is a schematic presentation of another embodiment of this invention.

The circuit shown in Figure 3 utilizes a multi-element electron tube 32 as the non-linear element. For purposes of illustration triode tubes are indicated. However, it should be understood that other vacuum tubes, such as pentodes, and other types of controllable current passing devices such as transistors may be utilized. The circuit shown may be operated by applying the signal of the cathode follower 12 simultaneously to all the grids 34 or, if a specific complex signal is desired, unidentical signals may be applied to each separate grid in accordance with the previous discussion.

As an additional improvement, the cathode follower is shown coupled to the stretcher by a capacitor 14 that prevents a D. C. bias from being applied to the crystals. In order to prevent capacitor 14 from being charged in turn by the crystals 6, an extra crystal diode 16 connected in such polarity that a positive going pulse may exist but not a negative bias.

A simple method of further increasing output pulse length is to substitute a resistor for shorting connection 8 and obtain the output pulse from across this resistor. In this circuit discharge of capacitors takes place through the resistor. However, since the line is not terminated in a short circuit or its characteristic impedance there is a secondary reflected wave which causes the capacitors to remain charged until this secondary wave is dissipated.

Many modifications without departing from the scope and spirit of the invention will be apparent to those skilled in the art. I desire it to be understood that I do not limit myself to the specific embodiments herein except as defined by the appended claims.

I claim:

1. An apparatus for elongating electrical impulses comprising a network having a plurality of delay sections each consisting of an inductor and a capacitor in series connection so as to provide a common junction, an inductor terminal, and a capacitor terminal, a first of said delay sections having said inductor terminal connected to said capacitor terminal, each succeeding delay section of said plurality having its inductor terminal connected to its preceding section, said common junction and its capacitor terminal connected to said preceding section capacitor terminal, a plurality of non-linear elements each connected to one of said common junctions, means for applying said impulses to said non-linear elements and means to derive an elongated output signal from the resulting final delay section.

2. An apparatus as in claim 1 wherein the non-linear elements are diode type electron tubes.

3. An apparatus as in claim 1 wherein the non-linear elements are semi-conductor diodes.

4. An apparatus as in claim 1 wherein said means for applying said impulses to said non-linear network is a low impedance source.

5. An electrical apparatus for generating electrical pulses having a delay line having a discharge and a signal output end composed of at least one "$\pi$" section formed of series inductance and shunt capacitors so that there is a capacitor, at each of said ends, a non-linear element connected to each of said capacitors, an inductance connected in parallel with said discharge end shunt capacitor serving as a means for discharging said line, a cathode follower circuit for introducing an impulse to said non-linear elements, means for deriving an output pulse from said line across said signal output end capacitor, a blocking capacitor between said cathode follower circuit and each of said non-linear elements and a rectifier arranged to discharge said blocking capacitor.

6. In an apparatus for stretching electrical impulses, a delay line including shunt capacitors and series inductances, a charging source for said delay line, a plurality of controllable non-linear elements connected in parallel between said charging source and said delay line at points equally spaced along said line, means for applying said impulse to said nonlinear elements, an inductance in shunt across one end of said line serving as a means for discharging said line, and means for deriving an output pulse from the other end of said line.

7. The electrical apparatus of claim 6 wherein said controllable non-linear elements are multi-element electron tubes.

8. An electrical apparatus for elongating electrical impulses comprising a delay line including series inductance and shunt capacitors, a plurality of non-linear elements each having a first terminal connected to a delay point on said line, resistance elements having a first terminal in series with a second terminal of said non-linear elements, means for applying said impulses to a second terminal of said resistance element, an inductance in shunt across one end of said line serving as a means to discharge said line, and means to deliver an elongated signal from the other end of said delay lines.

9. An electrical apparatus for elongating electrical impulses including a delay line having series inductance and shunt capacitors, a plurality of multi-element electron tubes having their plate circuits interposed between a plurality of delay points on said line and a source of electrical potential, means for applying said impulse simultaneously to the control grids of all of said tubes, an inductance in shunt across one end of said line serving as a means to discharge said line, and means for delivering an elongated signal from the other end of said delay line.

10. The apparatus of claim 9 wherein said electron tubes are triodes.

11. An electrical apparatus for generating electrical impulses comprising a delay line including series inductance and shunt capacitors, a source of electrical potential for charging said delay line, a plurality of controllable nonlinear elements arranged to connect said charging source with a plurality of delay points on said line, means for applying unlike electrical impulses to the control element of said elements, an inductance in shunt across one end of said line serving as a means to discharge said line, and means for delivering a signal from the other end of said delay line.

12. An electrical apparatus for elongating electrical impulses comprising a delay line including series inductance and shunt capacitors, a cathode follower circuit, each of a plurality of non-linear elements connected from said cathode follower circuit to an individual delay point of said line, an inductance in shunt across one end of said line serving as a means to discharge said line, and means for delivering an elongated signal from the other end of said delay line.

13. An electrical apparatus for elongating electrical impulses comprising a delay line including series inductance and shunt capacitors, each of a plurality of nonlinear elements connected to an individual delay point on said line, a low impedance driving source for supplying said impulses to said non-linear elements, an inductance in shunt across one end of said line serving as a means to discharge said line, and means for delivering an elongated signal from the other end of said delay line.

14. A pulse generator comprising a low impedance driving circuit, a transmission line having a predetermined time delay for energy passing thereover, an input circuit comprising a plurality of non-linear elements for coupling the output of said driving circuit simultaneously to a number of equally spaced points on said transmission line, a discharge circuit terminating one end of said line comprising an inductance, and an output circuit coupled to the other end of said transmission line for deriving a pulse of constant amplitude whose time duration is a function of the delay time of said line.

15. An electrical apparatus comprising a plurality of time delay sections connected in cascade, each section including a series inductance coil and a shunt capacitor, said network having output terminals at one end thereof and having a relatively low resistance connected across the other end thereof, means to apply unlike impulses to non-linear elements connected to each of said delay sections so that an impulse of complex waveshape having a duration relative to the time delay of said line is obtained.

16. An apparatus for generating complex electrical pulses comprising a driving stage, a plurality of voltage divider circuits connected in parallel arranged to receive signals from said driving stage, non-linear elements connected to said voltage dividers so as to have applied thereto only a portion of the signal voltage applied to said voltage divider circuit, a plurality of delay sections composed of inductors and capacitors connected in cascade so that said inductors are in series and said capacitors are in shunt each of said sections being connected to one of said non-linear elements, a low resistance discharge circuit at one end of said cascaded series adapted to discharge said delay sections, and a means to derive an output pulse from the other end of said cascaded series.

17. The apparatus of claim 16 wherein said voltage divider circuit is a variable potentiometer.

18. An electrical apparatus for elongating electrical impulses comprising a delay network including series inductance and shunt capacitors, a plurality of resistance elements each having a first terminal connected to a delay point on said network, non-linear elements having a first terminal in series with a second terminal of said resistance elements, means for applying said impulses to a second terminal of said non-linear element, means to discharge said network, and means to deliver an elongated signal from said delay lines.

References Cited in the file of this patent

UNITED STATES PATENTS

| | | |
|---|---|---|
| 2,227,906 | Kellogg | Jan. 7, 1941 |
| 2,266,154 | Blumlein | Dec. 16, 1941 |
| 2,303,968 | White | Dec. 1, 1942 |
| 2,457,559 | Huber | Dec. 28, 1948 |
| 2,539,465 | Parker | Jan. 30, 1951 |
| 2,556,200 | Lesti | June 12, 1951 |
| 2,592,738 | Rich | Apr. 15, 1952 |
| 2,617,883 | Anger | Nov. 11, 1952 |
| 2,644,130 | Summers | June 30, 1953 |
| 2,681,384 | Guanella | June 15, 1954 |